United States Patent
Cheng

(10) Patent No.: US 12,495,656 B2
(45) Date of Patent: Dec. 9, 2025

(54) FULL-COLOR LED EPITAXIAL STRUCTURE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 443 days.

(21) Appl. No.: 17/988,956

(22) Filed: Nov. 17, 2022

(65) Prior Publication Data

US 2023/0085021 A1 Mar. 16, 2023

Related U.S. Application Data

(63) Continuation of application No. PCT/CN2020/116790, filed on Sep. 22, 2020.

(51) Int. Cl.
*H10H 29/14* (2025.01)
*H10H 20/812* (2025.01)
(Continued)

(52) U.S. Cl.
CPC ........ *H10H 29/142* (2025.01); *H10H 20/812* (2025.01); *H10H 20/821* (2025.01); *H10H 20/825* (2025.01)

(58) Field of Classification Search
CPC .. H10H 29/142; H10H 20/812; H10H 20/819; H10H 20/821
See application file for complete search history.

(56) References Cited

U.S. PATENT DOCUMENTS 5,838,029 A * 11/1998 Shakuda ............ H10H 20/0137
257/190
6,072,197 A * 6/2000 Horino .................... H01L 24/49
257/94
(Continued)

FOREIGN PATENT DOCUMENTS

CN 102270716 A 12/2011
CN 104064582 A 9/2014
(Continued)

OTHER PUBLICATIONS

International Search Report issued in corresponding PCT Application No. PCT/CN2020/116790, dated Jun. 23, 2021.
(Continued)

*Primary Examiner* — Tucker J Wright
(74) *Attorney, Agent, or Firm* — Westbridge IP LLC

(57) ABSTRACT

Disclosed is a full-color LED epitaxial structure, having different area ratios of pillars corresponding to an unit area of a substrate, which is utilized to realize different flow rates of reaction gas around each of the pillars when a light-emitting layer is grown, and different doping efficiency of each element in the growing light-emitting layer, which in turn realizes different composition ratios of each element in the growing light-emitting layer and different light-emitting wavelengths of LED. The above process is simple and the full-color LED semiconductor structure can be produced on a single substrate. And light-emitting wavelengths of LED can be adjusted only by adjusting the area ratio of the pillars to adjust a composition ratio of the light-emitting layer, thus reducing manufacturing processes of the full-color LED.

18 Claims, 4 Drawing Sheets

(51) Int. Cl.
*H10H 20/821* (2025.01)
*H10H 20/825* (2025.01)

(56) References Cited

U.S. PATENT DOCUMENTS

| | | | |
|---|---|---|---|
| 6,366,025 | B1 | 4/2002 | Yamada |
| 2002/0117961 | A1 | 8/2002 | Hori et al. |
| 2019/0013366 | A1 | 1/2019 | Forrest et al. |
| 2019/0115390 | A1 | 4/2019 | Lai |
| 2019/0198561 | A1 | 6/2019 | Wildeson et al. |
| 2019/0206849 | A1* | 7/2019 | Jang ............... H10H 20/831 |
| 2019/0355878 | A1* | 11/2019 | Ahmed ............ H10H 20/8513 |
| 2021/0104574 | A1* | 4/2021 | Behringer ........ H10H 29/142 |

FOREIGN PATENT DOCUMENTS

| | | |
|---|---|---|
| CN | 106486587 A | 3/2017 |
| CN | 110678985 A | 1/2020 |
| JP | 2003158296 A | 5/2003 |

OTHER PUBLICATIONS

First Office Action issued in counterpart Chinese Patent Application No. 202080103955.3, dated Apr. 19, 2025.

* cited by examiner

FULL-COLOR LED EPITAXIAL STRUCTURE

CROSS-REFERENCE TO RELATED APPLICATIONS

The application is a continuation of International Application No. PCT/CN2020/116790, filed on Sep. 22, 2020, the entire contents of which are incorporated herein by reference.

TECHNICAL FIELD

The disclosure relates to the technical field of semiconductor, and in particular, to a full-color light-emitting diode (LED) epitaxial structure.

BACKGROUND

Light-emitting diode, or LED for short, uses recombination of electrons and holes to emit visible light. LED is mainly used in two fields, including lighting and display. Especially in the field of display, there is a developing trend in the future of higher image quality and higher definition (a larger quantity of pixels and a smaller size of pixels). A key technology to achieve high-definition display is an ultra-small light-emitting pixel, which requires a smaller size of full-color LED light-emitting units.

As a new generation of lighting device, LED has many advantages of high brightness, low cost, long lifetime, small size, energy saving and being environmentally friendly, etc. Currently, white LED is mainly realized in the following manners. According to a first method, phosphor is excited by ultraviolet LED (UV LED) to obtain white light, which is similar to the principle of fluorescent lamps. UV LED can emit light with longer wavelengths through organic or inorganic phosphor, so that visible light with wavelengths from blue light to red light can be obtained and white light emission can be realized. According to a second method, the phosphor is excited by blue light. A part of the blue light transmits through the phosphor, and the other is absorbed by the phosphor and then transformed into red light and green light. The white light emission is realized by a combination of three colors of light, which are the blue light, red light and green light. When the phosphor is excited by violet light, ultraviolet light or blue light, the light is absorbed by corresponding phosphor, and then transformed into light with longer wavelengths through down-conversion, which is of low efficiency according to Stokes shift. Meanwhile there is a phenomenon of light decay when the phosphor is used for a long time. Therefore, how to make full use of a patterned substrate, and design a full-color LED epitaxial structure of low cost, good color rendering, and no phosphor is significant to the further development of lighting industry.

SUMMARY

The disclosure aims to provide a full-color LED epitaxial structure. Light-emitting wavelengths of LED are adjusted only by adjusting area ratios of pillars on a substrate to adjust a composition ratio of the light-emitting layer, thus reducing manufacturing processes of the full-color LED.

To achieve the above object, the full-color LED epitaxial structure provided by the disclosure includes:

a substrate, a plurality of unit areas being periodically arranged on a surface of the substrate, and each of the plurality of unit areas including n sub-unit areas with n being a positive integer greater than or equal to 2;

a plurality of pillars, each of the plurality of pillars being correspondingly disposed in each of the sub-unit areas; and a light-emitting layer and a second-type semiconductor layer formed sequentially on an upper surface of each of the plurality of pillars, each of the plurality of pillars comprising a first-type semiconductor layer in contact with the light-emitting layer, and a conductivity type of the first-type semiconductor layer being opposite to a conductivity type of the second-type semiconductor layer;

wherein at least one area ratio, among n area ratios of n pillars corresponding to each of the plurality of unit areas, is different form the other area ratios of the n area ratios, and an area ratio of each of the plurality of pillars is a ratio between a horizontal cross-sectional area of the pillar and an area of a sub-unit area corresponding to the pillar.

Optionally, a height of each of the plurality of pillars ranges from 100 nm to 400 nm.

Optionally, area ratios of the n pillars corresponding to each of the unit areas are different.

Optionally, the each of the plurality of pillars only comprises the first-type semiconductor layer arranged between the light-emitting layer and the substrate.

Optionally, the each of the plurality of pillars further comprises a buffer layer and a nucleation layer.

Optionally, the substrate is a patterned substrate, and the each of the plurality of pillars further comprises a bump of the patterned substrate.

Optionally, the each of the plurality of pillars further comprises the bump of the patterned substrate, the buffer layer and the nucleation layer.

Optionally, the substrate is an N-type semiconductor substrate.

Optionally, the areas of the n sub-unit areas of each of the unit areas are the same, and at least one of the horizontal cross-sectional areas of the n pillars corresponding to each of the n sub-unit areas is different from the horizontal cross-sectional areas of the other n−1 pillars.

Optionally, 2n pillars of two adjacent unit areas are arranged in a mirror symmetrical manner.

Optionally, at least one area of the n sub-unit areas of each of the unit areas different from the areas of the other n−1 sub-unit areas, and horizontal cross-sectional areas of the n pillars are the same.

Optionally, 2n sub-unit areas of two adjacent unit areas are arranged in a mirror symmetrical manner.

Optionally, a material of the first-type semiconductor layer is Group III nitride, and/or a material of the light-emitting layer is Group III nitride, and/or a material of the second-type semiconductor layer is Group III nitride.

Optionally, the light-emitting layer is doped with In, and a composition ratio of In in the light-emitting layer grown upon each of the plurality of pillars is determined by the area ratio of each of the plurality of pillars.

Optionally, shapes of the n sub-unit areas are the same.

Optionally, at least one shape of the n sub-unit areas is different from the shapes of the other n−1 sub-unit areas.

Optionally, a shape of the sub-unit area is any one of a rectangle, a circle, a triangle, a hexagon, and a trapezoid.

Optionally, the light-emitting layer comprises at least one of a single quantum well structure, a multiple quantum well structure, a quantum line structure, and a quantum dot structure.

Optionally, the light-emitting layer comprises a trap layer and a potential barrier layer.

Optionally, a band gap of the trap layer is smaller than a band gap of the barrier layer.

Compared with the prior art, the disclosure has the following beneficial effects.

The area ratios of the patterned pillars corresponding to an unit area of the substrate are different, so that flow rate of reactive gas in each opening of the substrate is different when the light-emitting layer is grown. When the area ratio of the pillar decreases, a growth rate of the light-emitting layer on the upper surface of the patterned pillar will become faster. As doping efficiency of each element in a growing light-emitting layer is different, composition ratios of elements in the growing light-emitting layer are different and the light-emitting wavelengths of LED are different. The above process is simple and the full-color LED semiconductor structure can be produced on a single substrate, reducing the size and cost of the full-color LED.

DETAILED DESCRIPTION OF THE EMBODIMENTS

In order to make the above-mentioned objects, features and advantages of the disclosure more obvious and understandable, specific embodiments of the disclosure are described in detail below with reference to the accompanying drawings.

Figure 1:
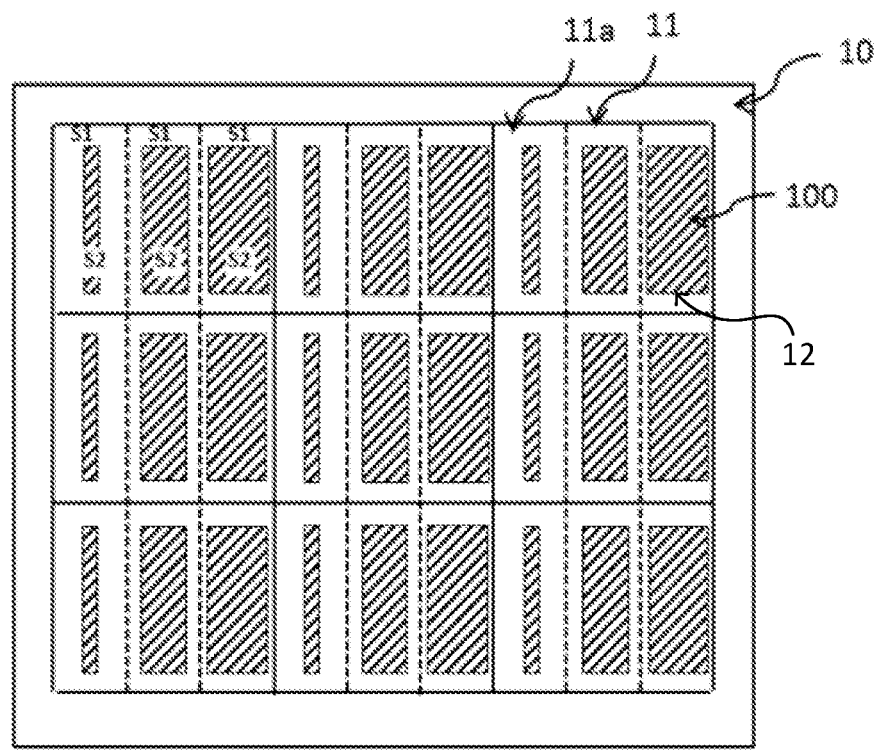
FIG. 1 is a top-view structural schematic diagram of a full-color LED epitaxial structure according to an embodiment of the disclosure.

FIG. 1 is a top-view structural schematic diagram of a full-color LED epitaxial structure according to an embodiment of the disclosure. As shown in FIG. 1, the full-color LED epitaxial structure includes a substrate 10, a plurality of unit areas 11 being periodically arranged on a surface of the substrate 10, and each of the plurality of unit areas 11 including n sub-unit areas 11a with n being a positive integer greater than or equal to 2.

In the embodiment, the full-color LED epitaxial structure is used for display. The plurality of unit areas 11 are arranged in an array, and each of the plurality of unit areas 11 corresponds to a pixel unit area and each of the sub-unit areas 11a corresponds to a sub-pixel area.

In other embodiments, the full-color LED epitaxial structure may also be used for illumination. The plurality unit areas 11 are arranged in an array, and each of the plurality of unit areas 11 corresponds to an illuminating unit area and each of the sub-unit areas 11a corresponds to a primary color light-emitting structure area.

In the embodiment shown in FIG. 1, n is preferably 3, and correspondingly an LED light-emitting structure 100 with three primary colors of red, green and blue is formed. In the embodiment shown in FIG. 1, areas S1 of the sub-unit areas 11a are the same.

In this embodiment, shapes of the sub-unit areas 11a are the same and are all rectangles. In other embodiments, the shape of each of the sub-unit area 11a may be different and/or the shape of the sub-unit area 11a may also be any one of a circle, a triangle, a hexagon, and a trapezoid. This embodiment does not limit a distribution, a shape, or an area size of each of the sub-unit area 11a.

In some embodiments, n may also be 4, and correspondingly an LED light-emitting structure with four primary colors of red, green, blue and yellow is formed.

At least one area ratio, among n area ratios of the n pillars 12 corresponding to each of the plurality of unit areas 11, is different from the other area ratios of the n area ratios, and the area ratio of the pillar 12 is a ratio between a horizontal cross-sectional area of the pillar 12 and an area of the sub-unit area 11a corresponding thereto.

In an embodiment, the areas of n sub-unit areas 11a of each of the unit areas 11 are the same, and at least one of the horizontal cross-sectional areas of the n pillars 12 corresponding to each of the n sub-unit areas 11a is different from the horizontal cross-sectional areas of the other n−1 pillars.

In the embodiment, as shown in FIG. 1, the areas S1 of the three sub-unit areas 11a corresponding to each of the unit areas 11 are the same, while the horizontal cross-sectional areas S2 of the correspondingly disposed pillars 12 within each of the sub-unit areas 11a are different, and the area ratios of the three pillars 12 corresponding to each of the unit areas 11 are different, so that composition ratios of elements in the light-emitting layer of the light-emitting structure 100 are different as the light-emitting layer is grown on an upper surface of the pillar 12.

Specifically, a height of each of the plurality of the pillars 12 ranges from 100 nm to 400 nm, which may prevent overlapping between the light-emitting layers of the sub-unit areas 11a of each of the unit areas 11, thereby avoiding a problem of cross-coloring.

Figure 2:
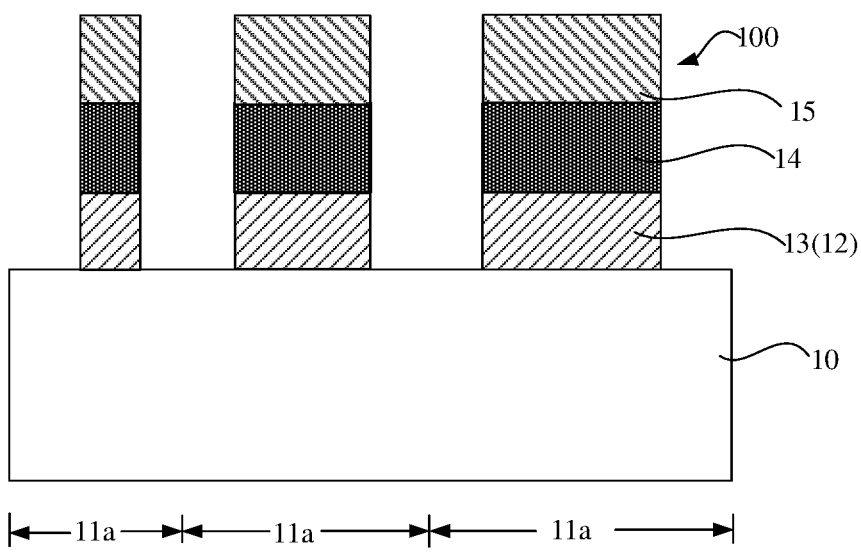
FIG. 2 is a cross-sectional structural schematic diagram of a full-color LED epitaxial structure according to an embodiment of the disclosure.

FIG. 2 is a cross-sectional structural schematic diagram of a full-color LED epitaxial structure according to an embodiment of the disclosure. The full-color LED epitaxial structure further includes a plurality of pillars 12 correspondingly disposed in each of the sub-unit areas 11a; a light-emitting layer 14 and a second-type semiconductor layer 15 formed sequentially on an upper surface of each of the plurality of pillars 12, wherein each of the plurality of pillars 12 includes a first-type semiconductor layer 13 in contact with the light-emitting layer 14, and a conductivity type of the first-type semiconductor layer 13 being opposite to a conductivity type of the second-type semiconductor layer 15, each of the plurality of pillars 12 only includes the first-type semiconductor layer 13 arranged between the light-emitting layer 14 and the substrate 10.

Figure 3:
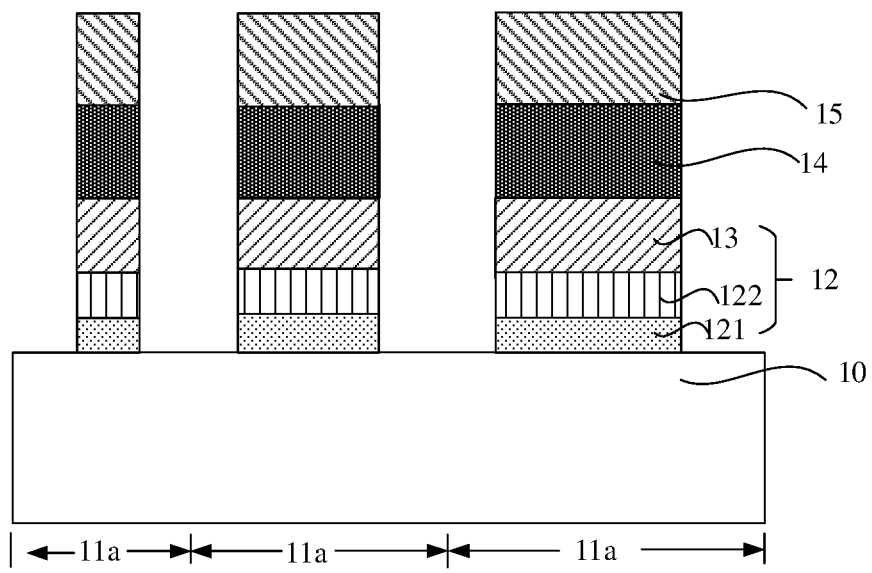
FIG. 3 is a cross-sectional structural schematic diagram of a full-color LED epitaxial structure according to an embodiment of the disclosure.

FIG. 3 is a cross-sectional structural schematic diagram of a full-color LED epitaxial structure according to an embodiment of the disclosure. The full-color LED epitaxial structure in the embodiment of FIG. 3 is substantially the same as the full-color LED epitaxial structure in the embodiment of FIG. 2 and differs only in that each of the plurality of pillars 12 further includes a buffer layer 121, a nucleation layer 122.

Figure 4:
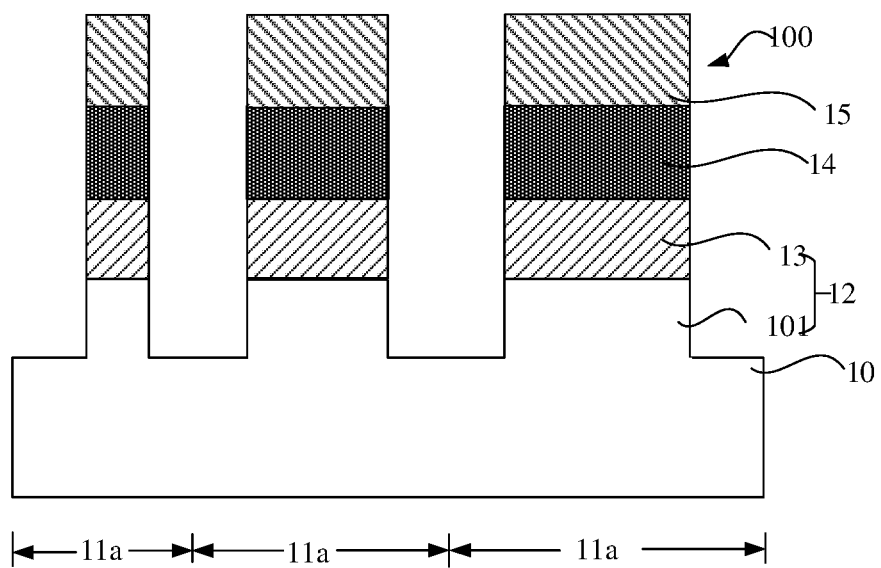
FIG. 4 is a cross-sectional structural schematic diagram of a full-color LED epitaxial structure according to an embodiment of the disclosure.

FIG. 4 is a cross-sectional structural schematic diagram of a full-color LED epitaxial structure according to an embodiment of the disclosure. The full-color LED epitaxial structure in the embodiment of FIG. 4 is substantially the same as the full-color LED epitaxial structure in the embodiment of FIG. 2 and differs only in that: the substrate 10 is a patterned substrate and each of the plurality of pillars 12 further includes a bump 101 of the patterned substrate 10.

Figure 5:
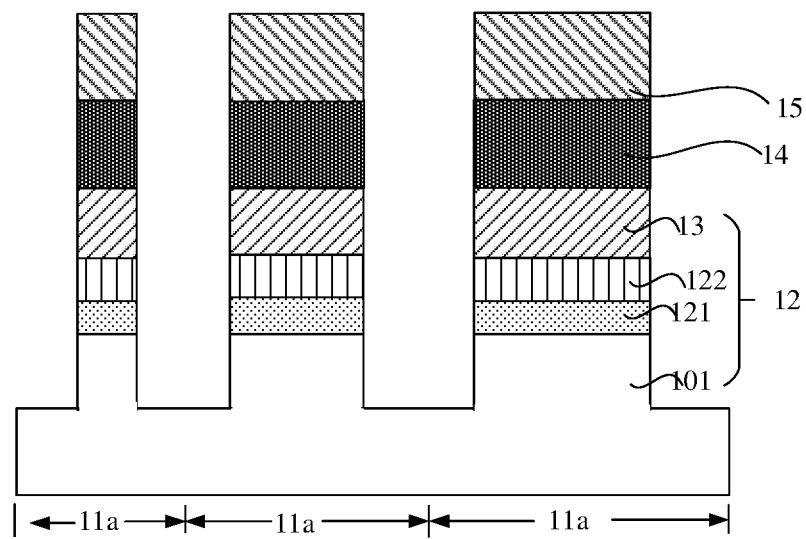
FIG. 5 is a cross-sectional structural schematic diagram of a full-color LED epitaxial structure according to an embodiment of the disclosure.

FIG. 5 is a cross-sectional structural schematic diagram of a full-color LED epitaxial structure according to an embodiment of the disclosure. The full-color LED epitaxial structure in the embodiment of FIG. 5 is substantially the same as the full-color LED epitaxial structure in the embodiment of FIG. 2 and differs only in that: each of the plurality of pillars 12 further includes a bump 101 of a patterned substrate 10, a buffer layer 121, a nucleation layer 122.

In an embodiment, the substrate 10 is an N-type semiconductor substrate, and at this time, the substrate 10 is conductive and may subsequently be used as an electrode of a light-emitting LED device without stripping.

The substrate 10 may also be a non-conductive substrate, such as a sapphire substrate, and at this time, after the second-type semiconductor is manufactured, the substrate 10 needs to be stripped before manufacturing the electrode of the light-emitting LED device.

The material of the first-type semiconductor layer 13 may be Group III nitride, which may specifically include at least one material of GaN and AlGaN.

It should be noted that in this embodiment, chemical elements are used to represent a certain material, but a molar ratio of each chemical element in the material is not limited, for example, GaN materials contain Ga element and N element, but the molar ratio of Ga element and N element is not limited; AlGaN materials contain Al element, Ga element and N element, but the molar ratio of each is not limited.

The first type may be P type, and P-type doping ions contain at least one of Mg ions, Zn ions, Ca ions, Sr ions, and Ba ions.

The P-type doped ions may be obtained by an in-situ doping process.

The light-emitting layer 14 may include at least one of a single quantum well structure, a multiple quantum well (MQW) structure, a quantum line structure, and a quantum dot structure. The light-emitting layer 14 may include a trap layer and a potential barrier layer. A band gap of the trap layer is smaller than a band gap of the barrier layer.

Materials of the light-emitting layer 14 may be GaN-based materials, which can be doped with In elements, such as InGaN, and can also be doped with Al elements, such as AlGaN. The band gap of InN is about 0.7 eV, less than the band gap of GaN of 3.4 eV. Therefore, the greater the doping amount of In is, the longer the light-emitting wavelength of the light-emitting layer 14 will be. The band gap of AlN is about 6.2 eV, greater than the band gap of GaN of 3.4 eV. Therefore the greater the doping amount of Al is, the shorter the light-emitting wavelength of the light-emitting layer 14 will be.

The growth process of GaN-based materials coping with In or Al can be referred to the above-mentioned growth process of Group III nitride materials.

The area ratios of the plurality of pillars 12 are different, therefore when the light-emitting layer 14 is grown on the upper surface of the plurality of pillars 12, flow rates of the reactive gas around the plurality of pillars 12 are different, and thus doping rates of In/Al elements and Ga elements are different, that is, doping efficiency of In/Al elements in the light-emitting layers 14 of the plurality of pillars 12 is different, which makes the composition ratios of In/Al elements in the growing light-emitting layers 14 different. Specifically, the lower the area ratio of the pillar 12 is, the faster the growth rate of base materials GaN of the light-emitting layer 14 will be. And as the doping of In elements has a better selectivity and the doping rate of In elements is greater than Ga elements, the lower the area ratio of each of the plurality of pillars 12 is, the higher the composition ratio of In elements in the light-emitting layer 14 of InGaN materials will be. In addition, the lower the area ratio of the pillar 12 is, the greater the thickness of the quantum well within the light-emitting layer 14 will be. And then the light-emitting wavelength will accordingly be increased because of the quantum Stark effect. Conversely, the higher the area ratio of the pillar 12 is, the less the difference between the doping rate of In element and the doping rate of Ga element will be, namely, the lower the doping efficiency of In is, the lower the composition ratio of In element in the growing light-emitting layer 14 will be. In another embodiment, Al element is doped in the base materials GaN of the light-emitting layer, and the lower the area ratio of the pillar 12 is, the faster the growth rate of the base materials GaN of the light-emitting layer 14 on the upper surface of the pillars 12 will be. However the growth of Al has no selectivity and the doping rate of Al element is smaller than the doping rate of Ga element, therefore, the lower the area ratio of the pillar 12 is, the lower the composition ratio of Al element in the light-emitting layer 14 of AlGaN will be, which causes less doping amount of Al and longer light-emitting wavelength of the light-emitting layer 14.

In addition, the higher the area ratio of the pillar 12 is, the less the thickness of the growing light-emitting layer 14 will be; the lower the area ratio of the pillar 12 is, the larger the thickness of the grown light-emitting layer 14 will be. The thickness of the quantum well is accordingly increased and the light-emitting wavelengths are subsequently increased because of the quantum Stark effect.

In this embodiment, the light-emitting layer 14 is doped with In element, and a composition ratio of In in the light-emitting layer 14 grown upon each of the plurality of pillars 12 is determined by the area ratio of each of the plurality of pillars 12.

The materials of the second-type semiconductor layer 15 may be Group III nitride, which may specifically includes at least one material of GaN and AlGaN.

The second type may be N type, and the N-type doping ions contain at least one of Si ions, Ge ions, Sn ions, Se ions and Te ions.

The growth process of N-type Group III nitride materials may be referred to the above-mentioned growth process of P-type Group III nitride materials.

In some embodiments, the first-type semiconductor layer 13 may be an N-type semiconductor layer and the second-type semiconductor layer 15 may be a P-type semiconductor layer.

The first-type semiconductor layer 13, the light-emitting layer 14, and the second-type semiconductor layer 15 of each of the sub-unit areas 11a form an LED structure. The LED structures of each of the unit areas 11 form an LED unit.

When the first-type semiconductor layer 13 and the second-type semiconductor layer 15 are applied with voltage to provide holes and electrons respectively, the higher the composition ratio of In element in the light-emitting layer 14 is, the longer the light-emitting wavelength will be; the lower the composition ratio of In element is, the shorter the light-emitting wavelength will be; the higher the composition ratio of Al element is, the shorter the light-emitting wavelength will be; the lower the composition ratio of Al element, the longer the light-emitting wavelength will be.

In subsequent processes, a first electrode and a second electrode may also be manufactured to form the LED device. Therein the first electrode electrically leads out the first-type semiconductor layer 13 and the second electrode electrically leads out the second-type semiconductor layer 15.

Figure 6:
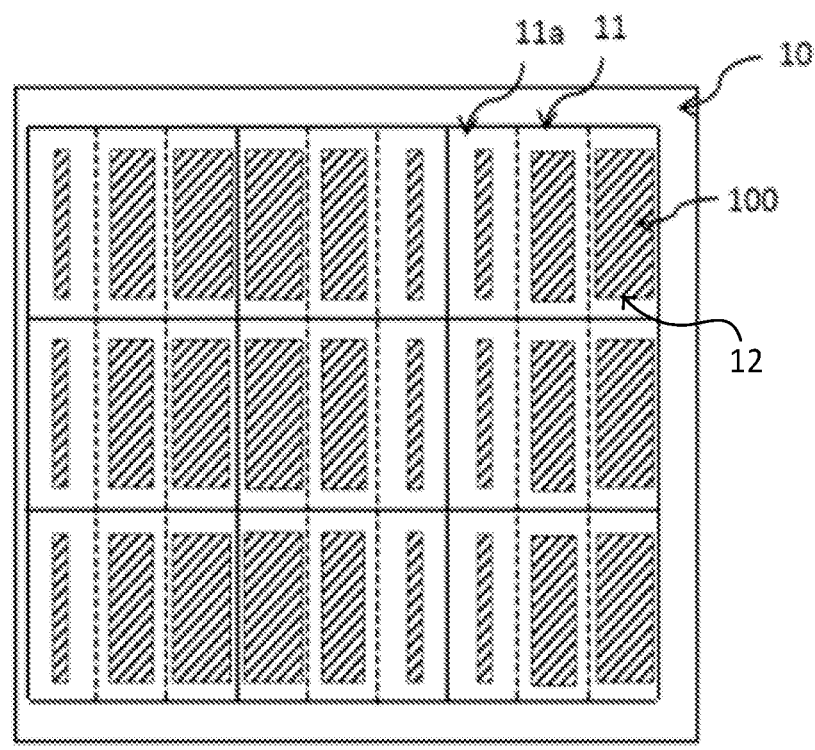
FIG. 6 is a top-view structural schematic diagram of a full-color LED epitaxial structure according to an embodiment of the disclosure.

FIG. 6 is a top-view structural schematic diagram of a full-color LED epitaxial structure according to an embodiment of the disclosure. The full-color LED epitaxial structure in the embodiment of FIG. 6 is substantially the same as the full-color LED epitaxial structure in the embodiments of FIG. 2, FIG. 3, FIG. 4 and FIG. 5, and differs only in that: 2n pillars 12 of two adjacent unit areas 11 are arranged in a mirror-symmetrical manner.

Compared with the arrangement of 2n sub-unit areas 11a in FIG. 1, the mirror-symmetric arrangement in this embodiment has an advantage that the pillars 12 with close area ratios are close to each other, which can stabilize the flow rate of the reactive gas and make the doping efficiency of In/Al elements stable and the composition ratio of In/Al elements in the growing light-emitting layer stable.

Figure 7:
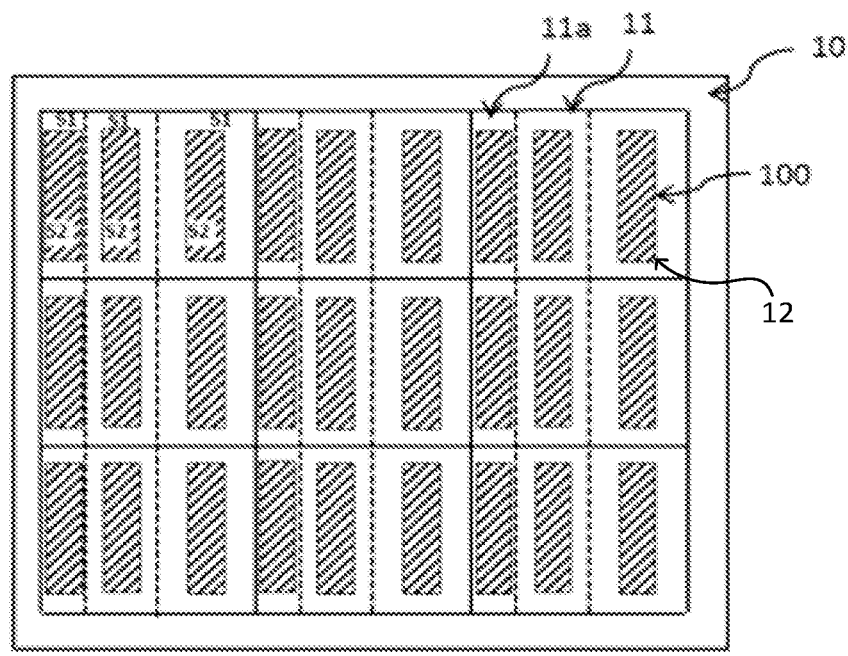
FIG. 7 is a top-view structural schematic diagram of a full-color LED epitaxial structure according to an embodiment of the disclosure.

FIG. 7 is a top-view structural schematic diagram of a full-color LED epitaxial structure according to an embodiment of the disclosure. The full-color LED epitaxial structure in the embodiment of FIG. 7 is substantially the same as the full-color LED epitaxial structure in the embodiments of FIG. 2, FIG. 3, FIG. 4 and FIG. 5 and differs only in that: the areas S1 of the sub-unit areas 11a in a unit area 11 are different, while the horizontal cross-sectional area S2 of each of the plurality of pillars 12 correspondingly disposed in each of the sub-unit areas 11a is the same. Thus, the area ratios of the plurality of pillars 12 corresponding to each of the unit areas 11 are different and the composition ratios of In/Al elements in the light-emitting layer of each of the plurality of pillars 12 are different, which makes the light-emitting wavelength different.

In an embodiment, at least one area of the n sub-unit areas 11a of each of the unit area 11 is different from the areas of the other n−1 sub-unit areas 11a, and horizontal cross-sectional areas of the n pillars 12 are the same.

Figure 8:
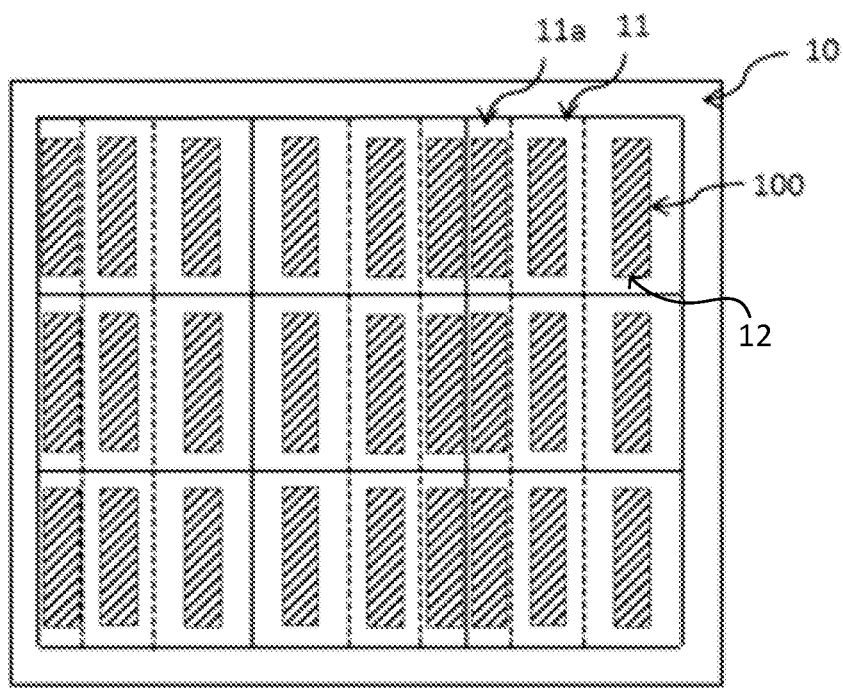
FIG. 8 is a top-view structural schematic diagram of a full-color LED epitaxial structure according to an embodiment of the disclosure.

FIG. 8 is a top-view structural schematic diagram of a full-color LED epitaxial structure according to an embodiment of the disclosure. The full-color LED epitaxial structure in the embodiment of FIG. 8 is substantially the same as the full-color LED epitaxial structure in the embodiment of FIG. 7, and differs only in that: 2n pillars 12 of two adjacent unit areas 11 are arranged in a mirror-symmetrical manner.

Compared with the arrangement of the 2n sub-unit areas 11a in FIG. 7, the mirror-symmetric arrangement in this embodiment has the advantage that the pillars 12 with close area ratios are close to each other, which can stabilize the flow rate of the reactive gas and make the doping efficiency of In/Al elements stable and the composition ratio of In/Al elements in the growing light-emitting layer stable.

In an embodiment, shapes of the plurality of pillars 12 are the same and are rectangles. In other embodiments, the shapes of the plurality of pillars 12 may be different and/or the shape of each of the plurality of pillars 12 may also be any one of a circle, a triangle, a hexagon, and a trapezoid.

Although the present application is disclosed as above, the disclosure is not limited therein. Any of those skilled in the art may make various changes and modifications without departing from the spirit and scope of the disclosure, and therefore the scope of protection of the disclosure shall be subject to the scope defined by the claims.

What is claimed is:

1. A full-color light-emitting diode (LED) epitaxial structure, comprising:
    a substrate, a plurality of unit areas being periodically arranged on a surface of the substrate, and each of the plurality of unit areas comprising n sub-unit areas, wherein n is a positive integer greater than or equal to 2;
    a plurality of pillars, each of the plurality of pillars being correspondingly disposed in each of the sub-unit areas; and
    a light-emitting layer and a second-type semiconductor layer formed sequentially on an upper surface of each of the plurality of pillars, each of the plurality of pillars comprising a first-type semiconductor layer in contact with the light-emitting layer, and a conductivity type of the first-type semiconductor layer being opposite to a conductivity type of the second-type semiconductor layer, and the light-emitting layer comprising a doping element;
    wherein at least one area ratio, among n area ratios of n pillars corresponding to each of the plurality of unit areas, is different from the other area ratios of the n area ratios to adjust a flow rate of reactive gas around each of the plurality of pillars to control a doping rate of the doping element in the light-emitting layer; and an area ratio of each of the plurality of pillars is a ratio between a horizontal cross-sectional area of the pillar and an area of a sub-unit area corresponding to the pillar.

2. The full-color LED epitaxial structure according to claim 1, wherein a height of each of the plurality of pillars ranges from 100 nm to 400 nm.

3. The full-color LED epitaxial structure according to claim 1, wherein area ratios of the n pillars corresponding to each of the unit areas are different.

4. The full color LED epitaxial structure according to claim 1, wherein each of the plurality of pillars consists of the first-type semiconductor layer arranged between the light-emitting layer and the substrate.

5. The full color LED epitaxial structure according to claim 1, wherein the each of the plurality of pillars further comprises a buffer layer and a nucleation layer.

6. The full color LED epitaxial structure according to claim 1, wherein the substrate is a patterned substrate, and the each of the plurality of pillars further comprises a bump of the patterned substrate.

7. The full color LED epitaxial structure according to claim 1, wherein the each of the plurality of pillars further comprises the bump of the patterned substrate, the buffer layer and the nucleation layer.

8. The full color LED epitaxial structure according to claim 1, wherein the substrate is an N-type semiconductor substrate.

9. The full color LED epitaxial structure according to claim 8, wherein 2n pillars of two adjacent unit areas are arranged in a mirror symmetrical manner.

10. The full color LED epitaxial structure according to claim 9, wherein 2n sub-unit areas of two adjacent unit areas are arranged in a mirror symmetrical manner.

11. The full-color LED epitaxial structure according to claim 1, wherein the areas of the n sub-unit areas of each of the unit areas are the same, and at least one of the horizontal cross-sectional areas of the n pillars corresponding to each of the n sub-unit areas is different from the horizontal cross-sectional areas of the other n−1 pillars.

12. The full-color LED epitaxial structure according to claim 1, wherein at least one area of the n sub-unit areas of each of the unit areas is different from the areas of the other n−1 sub-unit areas, and horizontal cross-sectional areas of the n pillars are the same.

13. The full color LED epitaxial structure according to claim 1, wherein a material of the first-type semiconductor layer is Group III nitride, and/or a material of the light-emitting layer is Group III nitride, and/or a material of the second-type semiconductor layer is Group III nitride.

14. The full color LED epitaxial structure according to claim 1, wherein the light-emitting layer is doped with In, and a composition ratio of In in the light-emitting layer grown upon each of the plurality of pillars is determined by the area ratio of each of the plurality of pillars.

15. The full color LED epitaxial structure according to claim 1, wherein shapes of the n sub-unit areas are the same.

16. The full color LED epitaxial structure according to claim 1, wherein the light-emitting layer comprises at least one of a single quantum well structure, a multiple quantum well structure, a quantum line structure, and a quantum dot structure.

17. The full color LED epitaxial structure according to claim 1, wherein the light-emitting layer comprises a trap layer and a potential barrier layer.

18. The full color LED epitaxial structure according to claim 17, wherein a band gap of the trap layer is smaller than a band gap of the barrier layer.

* * * * *